US009399594B2

(12) United States Patent
Haase Pastel et al.

(10) Patent No.: US 9,399,594 B2
(45) Date of Patent: Jul. 26, 2016

(54) MASK AND METHOD FOR SEALING A GLASS ENVELOPE

(71) Applicant: CORNING INCORPORATED, Corning, NY (US)

(72) Inventors: Michelle Nicole Haase Pastel, Horseheads, NY (US); Brian Paul Strines, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 215 days.

(21) Appl. No.: 13/886,824

(22) Filed: May 3, 2013

(65) Prior Publication Data

US 2013/0239622 A1 Sep. 19, 2013

Related U.S. Application Data

(62) Division of application No. 12/157,515, filed on Jun. 11, 2008, now Pat. No. 8,448,468.

(51) Int. Cl.
*C03B 23/203* (2006.01)
*H01L 51/52* (2006.01)
*H01L 51/56* (2006.01)

(52) U.S. Cl.
CPC .......... *C03B 23/203* (2013.01); *H01L 51/5246* (2013.01); *H01L 51/56* (2013.01)

(58) Field of Classification Search
CPC .............................. C03B 23/20; C03B 23/203
See application file for complete search history.

(56) References Cited

U.S. PATENT DOCUMENTS 3,117,025 A 1/1964 Learn et al.
3,414,465 A 12/1968 Baak et al.
3,778,126 A 12/1973 Wilson
(Continued)

FOREIGN PATENT DOCUMENTS

JP 58211743 A 12/1983
JP 10074583 A 3/1998
(Continued)

OTHER PUBLICATIONS

Japanese Office Action; Yanagida & Associates translation of Japanese Patent Office—dated Aug. 19, 2013.

*Primary Examiner* — Queenie Dehghan
(74) *Attorney, Agent, or Firm* — Kevin M. Able (57) ABSTRACT

A mask for laser sealing a temperature and environmentally sensitive element, such as an OLED device, surrounded by a frit wall between first and second substrates. The mask is opaque and has a transparent elongate transmission region. The width of the transmission region may be substantially equal to the width of the frit wall. A strip of opaque mask material extends approximately along a longitudinal center line of the elongate transmission region. The mask is located between a laser and the first or second substrate. The laser emits a generally circular beam having a diameter that is larger than the width of the frit wall and is directed through the transmission region in the mask, such that opaque portions of the mask block portions the laser beam and the transparent transmission region allows a portion of the laser beam to pass through the mask and impinge upon the frit wall to melt the frit wall, thereby joining the first and second substrates and hermetically sealing the element therebetween. A process and system for sealing such an element between a first substrate and a second substrate separated by at least one frit wall employing such mask.

21 Claims, 4 Drawing Sheets

(56) References Cited

U.S. PATENT DOCUMENTS

| | | | |
|---|---|---|---|
| 3,995,941 A | 12/1976 | Nagahara et al. | |
| 4,400,870 A | 8/1983 | Islam | |
| 5,489,321 A | 2/1996 | Tracy et al. | |
| 5,682,453 A | 10/1997 | Daniel et al. | |
| 5,693,111 A | 12/1997 | Kadowaki et al. | |
| 5,821,692 A | 10/1998 | Rogers et al. | |
| 5,827,622 A * | 10/1998 | Coufal et al. | 430/5 |
| 5,872,355 A | 2/1999 | Hueschen | |
| 5,874,804 A | 2/1999 | Rogers | |
| 5,998,805 A | 12/1999 | Shi et al. | |
| 6,069,443 A | 5/2000 | Jones et al. | |
| 6,097,420 A * | 8/2000 | Baba et al. | 347/258 |
| 6,117,752 A * | 9/2000 | Suzuki | 438/487 |
| 6,129,603 A | 10/2000 | Sun et al. | |
| 6,137,221 A | 10/2000 | Roitman et al. | |
| 6,146,225 A | 11/2000 | Sheats et al. | |
| 6,226,890 B1 | 5/2001 | Boroson et al. | |
| 6,268,695 B1 | 7/2001 | Affinito | |
| 6,331,348 B1 * | 12/2001 | Sakai et al. | 428/209 |
| 6,356,376 B1 | 3/2002 | Tonar et al. | |
| 6,370,019 B1 | 4/2002 | Matthies et al. | |
| 6,465,953 B1 | 10/2002 | Duggal | |
| 6,470,594 B1 | 10/2002 | Boroson et al. | |
| 6,501,044 B1 | 12/2002 | Klockhaus et al. | |
| 6,733,850 B1 | 5/2004 | Domi et al. | |
| 6,952,078 B1 | 10/2005 | Guenther | |
| 6,998,776 B2 | 2/2006 | Aitken et al. | |
| 7,078,726 B2 | 7/2006 | Pichler et al. | 257/40 |
| 7,255,823 B1 | 8/2007 | Guenther et al. | |
| 7,537,504 B2 | 5/2009 | Becken et al. | |
| 7,862,396 B2 | 1/2011 | Lee | |
| 2001/0048234 A1 | 12/2001 | Liu et al. | |
| 2002/0125822 A1 | 9/2002 | Graff et al. | |
| 2002/0149312 A1 | 10/2002 | Roberts et al. | |
| 2003/0066311 A1 | 4/2003 | Li et al. | |
| 2004/0069017 A1 | 4/2004 | Li et al. | |
| 2005/0001545 A1 | 1/2005 | Aitken et al. | |
| 2005/0151151 A1 | 7/2005 | Hawtof et al. | |
| 2006/0009109 A1 | 1/2006 | Aitken et al. | |
| 2006/0082298 A1 | 4/2006 | Becken et al. | 313/512 |
| 2007/0090759 A1 | 4/2007 | Choi et al. | |
| 2007/0096631 A1 | 5/2007 | Sung et al. | |
| 2007/0114909 A1 | 5/2007 | Park et al. | |
| 2007/0128967 A1 | 6/2007 | Becken et al. | 445/25 |
| 2007/0170324 A1 | 7/2007 | Lee et al. | |
| 2007/0170423 A1 | 7/2007 | Choi et al. | |
| 2007/0170455 A1 | 7/2007 | Choi et al. | |
| 2007/0170605 A1 | 7/2007 | Lee et al. | |
| 2007/0170839 A1 | 7/2007 | Choi et al. | |
| 2007/0170845 A1 | 7/2007 | Choi et al. | |
| 2007/0170846 A1 | 7/2007 | Choi et al. | |
| 2007/0170849 A1 | 7/2007 | Park | |
| 2007/0170850 A1 | 7/2007 | Choi et al. | |
| 2007/0170854 A1 | 7/2007 | Kwak | |
| 2007/0170855 A1 | 7/2007 | Choi et al. | |
| 2007/0170856 A1 | 7/2007 | Cha | |
| 2007/0170859 A1 | 7/2007 | Choi et al. | |
| 2007/0170860 A1 | 7/2007 | Choi et al. | |
| 2007/0170861 A1 | 7/2007 | Lee et al. | |
| 2007/0171637 A1 | 7/2007 | Choi | |
| 2007/0173167 A1 | 7/2007 | Choi | |
| 2008/0110561 A1 | 5/2008 | Lee et al. | 156/275.3 |
| 2009/0295277 A1 | 12/2009 | Logunov et al. | 313/504 |

FOREIGN PATENT DOCUMENTS

| | | |
|---|---|---|
| JP | 2003187962 A | 7/2003 |
| JP | 2006-524419 | 10/2006 |
| KR | 10-0711895 | 4/2007 |
| KR | 10-0769443 | 10/2007 |
| WO | 9312049 A1 | 6/1993 |
| WO | 2006/045067 A1 | 4/2006 |

\* cited by examiner

MASK AND METHOD FOR SEALING A GLASS ENVELOPE

CROSS-REFERENCE TO RELATED APPLICATIONS

The present application is a divisional application of, co-pending with, and claims the priority benefit U.S. patent application Ser. No. 12/157,515, filed on Jun. 11, 2008, entitled "MASK AND METHOD FOR SEALING A GLASS ENVELOPE," the entirety of which is incorporated herein by reference.

BACKGROUND OF THE INVENTION

1. Field of the Invention

This invention is directed to a mask and method for laser sealing a glass envelopes, such as frit sealed flat OLED display panels.

2. Technical Background

Organic light emitting diodes (OLEDs) have been the subject of considerable research in recent years because of their use and potential use in a wide variety of electroluminescent devices. For instance, a single OLED can be used in a discrete light emitting device or an array of OLEDs can be used in lighting or flat-panel display applications (e.g., OLED displays). OLED flat panel displays in particular are known to be very bright and to have good color contrast and wide viewing angle. However, OLED displays, and in particular the electrodes and organic layers located therein, are susceptible to degradation resulting from interaction with oxygen and moisture leaking into the OLED display from the ambient environment. It is well known that the life of the environmentally sensitive OLED display can be significantly increased if the electrodes and organic layers located therein are hermetically sealed from the ambient environment. Unfortunately, in the past it has been very difficult to develop a sealing process to hermetically seal the OLED display. Hermetically sealing an environmentally sensitive device such as an OLED is complicated by the fact that the OLED material is sensitive to temperature and will be destroyed if heated to temperatures exceeding about 100 to about 120 degrees Celsius.

One way to seal the temperature sensitive OLED devices located between a cover glass and a substrate glass is to place a line of low temperature glass frit, doped with a material that is highly absorbent at a specific wavelength of light, between the cover glass and the substrate glass and surrounding the OLED devices. A hermetic seal is formed around the OLED device by melting the frit with, for example, a high power laser or other radiation source, thereby heating and melting the frit. As the flit line cools it hardens, joining the cover glass to the substrate glass and forming a hermetic seal around the OLED devices. Use of a high power laser enables quick localized heating of the frit without overheating the temperature sensitive OLED material that is closely adjacent the line or wall of frit surrounding the OLED device. The line or wall of frit is typically about 0.5 mm to 1 mm wide and approximately 6-100 um thick or high, but in some instances may be about 1.5 mm or more wide.

It is known to frit seal OLED devices through irradiation with a laser beam having a Gaussian profile. Due to the profile of the laser beam, the thermal distribution created transversely across the frit line is a gradient, with a peak temperature at the center of the frit line. The peak temperature in the frit during laser sealing may be as high as approximately 600° C. This peak temperature can result in undesirable changes in materials located between the frit and the backplane, such as melting lead materials, causing separation of lead materials from the backplane, or any other number of thermally induced changes in backplane materials. There is a need in the art for an effective, high yield (e.g. low defective seal rate) laser frit sealing process for hermetically sealing environmentally sensitive devices (e.g. devices that are sensitive to oxygen, moisture, or other elements in the ambient environment) that are also sensitive to elevated temperatures, such as OLEDs, while avoiding thermal damage to the devices located within the flit wall and to other backplane material located between the frit and the backplane.

SUMMARY

In one embodiment according to the present invention, a method is disclosed comprising providing a first substrate and a second substrate separated by at least one frit wall, and at least one display element disposed between the first and second substrates, impinging a laser beam through a mask and on to the at least one frit wall through the first or second substrate and traversing the beam along a length of the wall to heat the frit and seal the first substrate to the second substrate.

In a further embodiment of the present invention, a method of encapsulating a temperature and environmentally sensitive element is provided that comprises the steps of providing a first substrate and a second substrate separated by at least one frit wall having a height extending between the first and second substrates and a width, and at least one temperature and environmentally sensitive element disposed between the first and second substrates and surrounded by the frit wall; providing a laser that generates a laser beam having a generally circular beam profile having a diameter that is larger than the width of the frit wall; providing an opaque mask for blocking the laser beam, the mask having a substantially transparent elongate transmission opening or region having a length and a width in the opaque material for allowing an elongate portion of the laser beam to pass through the mask, the width of the transmission opening being substantially equal to the width of the frit wall, and a strip of opaque material extending approximately along a longitudinal center line of the elongate transmission opening for blocking a central portion of the elongate portion of the laser beam; locating the mask between the laser and the first substrate or the second substrate, with the elongate transmission opening aligned with the frit wall; and directing the laser beam through the transmission opening in the mask, whereby the transmitted portion of the laser beam impinges upon the frit wall, melting the frit wall, without overheating and damaging the element, thereby joining the first and second substrates and hermetically sealing the element therebetween.

The frit wall may comprise a closed frame surrounding the element and the transmission opening is formed in a correspondingly sized and shaped closed frame.

The method may include the step of creating relative motion between (i) the first and second substrates and (ii) the laser beam and the mask, whereby the transmitted portion of the laser beam is traversed along the frit wall.

The method may include the step creating relative motion between (i) the first and second substrates and the mask and (ii) to the laser beam, whereby the transmitted portion of the laser beam is traversed along the frit wall.

The laser beam may traverse the frit wall at a speed greater than about 10 mm/s, or a speed greater than about 30 mm/s. The laser beam may be traversed relative the frit wall by reflecting the beam from at least one moving reflector.

The frit wall may have a height between 10 and 30 μm.

The mask may have a reflective surface or an absorbing surface.

The laser beam may have a spot diameter that is greater than about 2 times the width of the frit wall.

The present invention also provides a mask for laser sealing a temperature and environmentally sensitive element located between a first substrate and a second substrate separated by at least one frit wall having a height extending between the first and second substrates and a width, and at least one temperature and environmentally sensitive element disposed between the first and second substrates and surrounded by the frit wall. The mask may include an opaque mask having a substantially transparent elongate transmission opening or region having a length and a width in the opaque material, the width of the transmission opening being substantially equal to the width of the frit wall, and a strip of opaque material extending approximately along a longitudinal center line of the elongate transmission opening, whereby, when the mask is located between a laser, that emits a generally circular beam having a diameter that is larger than the width of the frit wall, and the first substrate or second substrate with the length of the elongate transmission opening aligned with the frit wall, the opaque portions of the mask between the laser and the first or second substrate block portions of the laser beam and the transparent transmission opening allows a portion of the laser beam to pass through the mask and impinge upon the frit wall to melt the frit wall, thereby joining the first and second substrates and hermetically sealing the element therebetween.

The elongate and transmission opening and the strip of opaque material may be generally elliptical or slit shaped.

The present invention also provides a system for laser sealing a temperature and environmentally sensitive element located between a first substrate and a second substrate separated by at least one frit wall having a height extending between the first and second substrates and a width, and at least one temperature and environmentally sensitive element disposed between the first and second substrates and surrounded by the frit wall. The system may include a table, the first substrate and the second substrate with the at least one temperature and environmentally sensitive element surrounded by the frit wall between the first and second substrates being supported on the table; a laser that generates a laser beam having a generally circular beam profile having a diameter that is larger than the width of the frit wall; an opaque mask located between the laser and the first or the second substrate for blocking a portion of the laser beam, the mask having a substantially transparent elongate transmission opening or region having a length and a width in the opaque material for allowing an elongate portion of the laser beam to pass through the mask, the width of the transmission opening being substantially equal to the width of the frit wall, and a strip of opaque material extending approximately along a longitudinal center line of the elongate transmission opening for blocking a central portion of the elongate portion of the laser beam, the mask being oriented with the elongate transmission opening aligned with the frit wall; and a fixture, the laser beam being mounted to the fixture to direct the laser beam through the transmission opening in the mask, whereby the transmitted portion of the laser beam impinges upon the frit wall, melting the frit wall, without overheating and damaging the element, thereby joining the first and second substrates and hermetically sealing the element therebetween.

The elongate and transmission opening and the strip of opaque material may be generally elliptical or generally slit shaped.

The system may include a motion control mechanism operatively connected to at least one of the fixture and the table to create relative motion between the table and the fixture, whereby the transmitted portion of the laser traverses the frit wall, melting the frit wall, without overheating and damaging the element, thereby joining the first and second substrates and hermetically sealing the element therebetween.

The frit wall may comprises a closed frame surrounding the element, the transmission opening is formed in a correspondingly sized and shaped closed frame, and the mask is held stationary relative the table with the transmission opening aligned with the frit wall.

The motion control mechanism may be operatively connected to the fixture to move the fixture relative to the fixture, or to the table to move the table relative to the fixture.

The mask may be held stationary relative the laser with the transmission opening aligned with the frit wall, and the motion control mechanism may be operatively connected to the table to move the fixture relative to the table.

In other embodiments of the present invention, a plurality of display elements may be disposed between the first and second substrates. The beam preferably passes through a mask comprising a transparent region shaped as a slit, with a strip of opaque mask material along the center of the slit. The mask may be formed of a material having an absorbing surface or a reflective surface. The beam is preferably traversed over the frit at a speed greater than about 10 mm/s, greater than about 30 mm/s or greater than about 50 mm/s. The traversing may be accomplished by reflecting the beam from at least one galvanic mirror.

The invention will be understood more easily and other objects, characteristics, details and advantages thereof will become more clearly apparent in the course of the following explanatory description, which is given, without in any way implying a limitation, with reference to the attached Figures. It is intended that all such additional systems, methods features and advantages be included within this description, be within the scope of the present invention, and be protected by the accompanying claims.

DETAILED DESCRIPTION

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

Although the sealing techniques of the present invention are described below with respect to manufacturing a hermetically sealed OLED display, it should be understood that the same or similar sealing techniques can be used to seal two glass plates to one another for a wide variety of applications and devices, especially for sealing temperature and/or environmentally or moisture sensitive devices between two sheets of glass. Accordingly, the sealing techniques of the present invention should not be construed in a limited manner and should not be limited to the sealing of OLED devices unless explicitly limited as such in the appended claims.

Figure 1:
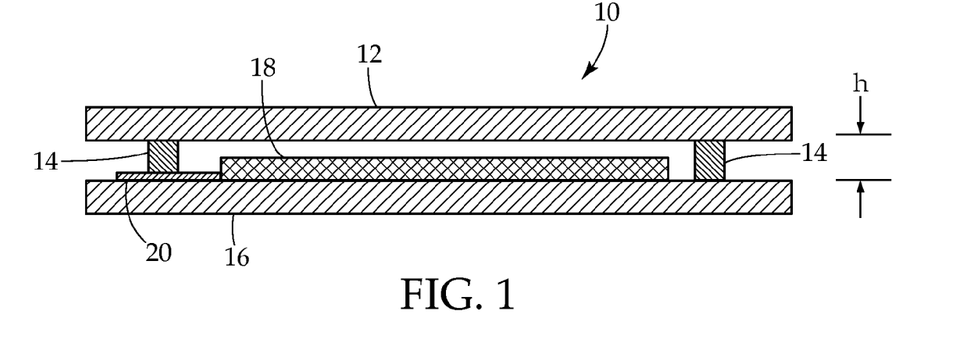
FIG. 1 is a cross sectional side view of a display device according to an embodiment of the present invention.

Referring to FIG. 1, a cross-sectional side view of a hermetically sealed organic light emitting diode (OLED) display device in accordance with an embodiment of the present invention is shown, generally designated by reference numeral 10, comprising first substrate 12, frit 14, second substrate 16, at least one OLED element 18 and at least one electrode 20 in electrical contact with the OLED element. Typically, OLED element 18 is in electrical contact with an anode electrode and a cathode electrode. As used herein, electrode 20 in FIG. 1 represents either electrode. Although only a single OLED element is shown for simplicity, display device 10 may have many OLED elements disposed therein and many electrodes in electrical contact with the OLED elements. The typical OLED element 18 includes one or more organic layers (not shown) and anode/cathode electrodes. However, it should be readily appreciated by those skilled in the art that any known OLED element 18 or future OLED element 18 can be used in display device 10. In addition, it should be appreciated that another type of thin film device can be deposited in place of OLED element 18. For example, thin film sensors, MEMs devices, photovoltaic devices, or other moisture or environmentally sensitive devices or materials may be sealed using the present invention.

In a preferred embodiment, first substrate 12 is a transparent glass plate like the ones manufactured and sold by Corning Incorporated under the brand names of Code 1737 glass or Eagle 2000™ glass. Alternatively, first substrate 12 can be any transparent glass plate such as, for example, the ones manufactured and sold by Asahi Glass Co. (e.g., OA10 glass and OA21 glass), Nippon Electric Glass Co., NHTechno, Samsung Corning Precision Glass Co., soda lime based glasses and other glasses such as Corning's 0211. Second substrate 16 may be the same glass substrate as first substrate 12, or second substrate 16 may be a non-transparent substrate.

Figure 2:
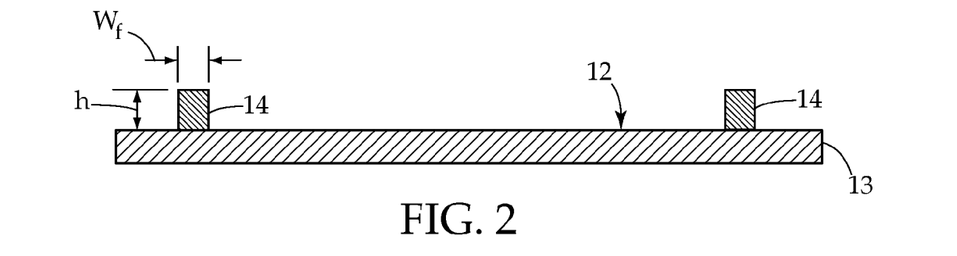
FIG. 2 is a cross sectional side view of the first substrate and the frit deposited thereon in accordance with an embodiment of the present invention.
Figure 3:
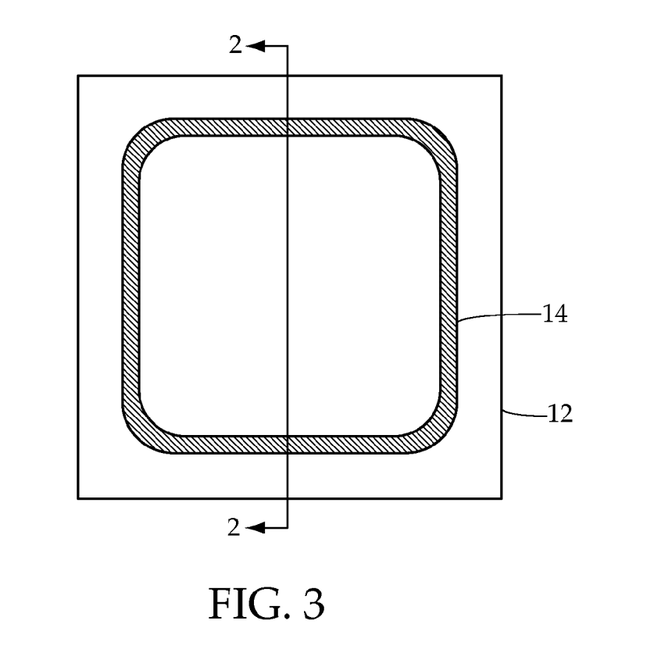
FIG. 3 is a top view of the first substrate of FIG. 2 showing the frit deposited in the shape of a frame.

As shown in FIGS. 2-3, prior to sealing first substrate 12 to second substrate 16, frit 14 is deposited on first substrate 12, typically as a line or wall of a frit paste comprising a glass powder, a binder (usually organic) and/or a liquid vehicle. Frit 14 can be applied to first substrate 12 by screen-printing or by a programmable pen dispensing robot which provides a pattern of flit on first substrate 12. For example, frit 14 can be placed approximately 1 mm away from the free edges 13 of first substrate 12, and is typically deposited in the shape of a closed frame or wall. The frame or wall of frit is sized and located on the first substrate such that when the first substrate is located on a second substrate having and OLED display device, for example, formed thereon, the frame or wall of frit 14 surrounds the OLED display device 18.

In one embodiment, frit 14 is a low temperature glass frit that has a substantial optical absorption at a predetermined wavelength which matches or substantially matches the operating wavelength of a laser used in the sealing process. Frit 14 may, for example, contain one or more light absorbing ions chosen from the group including iron, copper, vanadium, neodymium and combinations thereof (for example). Frit 14 may also include a filler (e.g., an inversion filler or an additive filler) which changes the coefficient of thermal expansion of frit 14 so that it matches or substantially matches the coefficient of thermal expansions of substrates 12 and 16. For a more detailed description regarding exemplary frit compositions that may be used in this application, reference is made to commonly owned U.S. Pat. No. 6,998,776 entitled "Glass Package that is Hermetically Sealed with a Frit and Method of Fabrication", the contents of which are incorporated by reference herein.

Frit 14 may also be pre-sintered prior to sealing first substrate 12 to second substrate 16. To accomplish this, the first substrate 12 with the frit pattern located thereon may be placed in a furnace which "fires" or consolidates frit 14 at a temperature that depends on the composition of the frit. During pre-sintering, organic binder materials contained within the frit are burned out of the frit.

After frit 14 is pre-sintered, it can be ground, if necessary, so that the height variation along the flit line does not exceed about 2-4 μm, with a typical target height h which can be 10 μm to greater than 30 μm, depending on the application for device 10; however, more typically height h is about 12-20 μm. If the height variation is larger, a gap which may be formed between the frit and substrate 16 when substrates 12 and 16 are joined may not close when frit 14 melts during laser sealing to a second substrate, or the gap may introduce stresses which can crack the substrates, particularly during cooling of the frit and/or substrates. An adequate but not overly thick frit height h allows the substrates to be sealed from the backside of first substrate 12. If frit 14 is too thin, then it does not leave enough material to absorb the laser radiation, resulting in failure. If frit 14 is too thick, then it will be able to absorb enough energy at the first surface to melt, but will prevent the necessary energy needed to melt the frit from reaching the region of the frit proximate secondary substrate 16. This usually results in poor or spotty bonding of the two glass substrates.

If the pre-sintered frit 14 is ground, first substrate 12 may go through a mild ultrasonic cleaning environment to remove any debris that has accumulated to this point. The typical solutions used here can be considerably milder than those typically used for cleaning bare display glass, so as not to damage or remove the frit. During cleaning, the temperature can be kept low to avoid degradation of deposited frit 14.

After cleaning, a final processing step can be performed to remove residual moisture. The pre-sintered first substrate 12 can be placed in a vacuum oven at a temperature of 100° C. or 300° C. in $N_2$ for 6 or more hours. After removal from the oven, the pre-sintered first substrate 12 can be placed in a clean, dry environment to deter accumulation of debris and moisture on the pre-sintered substrate prior to the sealing process.

Figure 4:
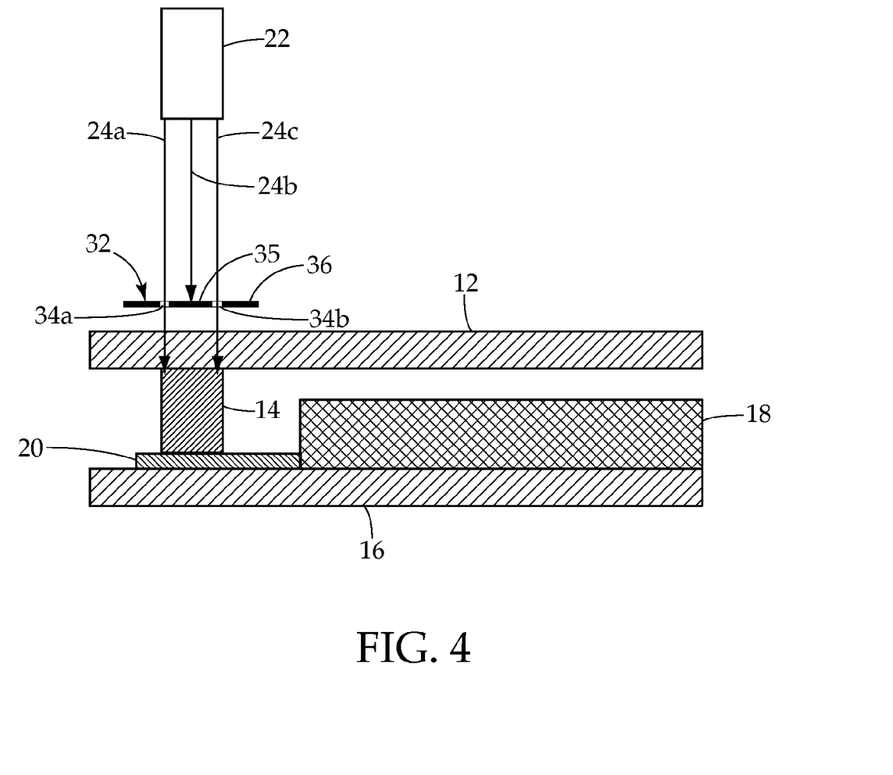
FIG. 4 is a partial side cross sectional view of a display including a display element and electrodes deposited thereon, and showing the position of the laser, laser beam, and mask in accordance with an embodiment of the present invention during the sealing operation.

The sealing process includes placing first substrate 12 with frit 14 on top of second substrate 16, with one or more OLEDs 18 and one or more electrodes 20 deposited on the second substrate 16, in such a manner that frit 14, the one or more OLEDs 18, and electrodes 20 are sandwiched between the two substrates 12 and 16, with the frit wall 14 surrounding the OLEDs. Mild pressure can be applied to substrates 12 and 16 to keep them in contact during the sealing process. As shown in FIG. 4, laser 22 directs laser beam 24a-c onto frit 14 through first substrate 12 and heats frit 14 such that frit 14 melts and forms a hermetic seal which connects and bonds substrate 12 to substrate 16. The hermetic seal also protects OLEDs 18 by preventing oxygen and moisture in the ambient environment from entering into OLED display 10.

Laser beam 24a-c can be defocused, for example, to make the temperature gradient within frit 14 more gradual. It should be noted that if the gradient is too steep (focus is too tight), OLED display 10 may exhibit cracking and subsequent failure. Frit 14 generally needs a warm up and cool down phase before and after melting. In addition, the pre-sintered first substrate should be stored in an inert atmosphere to prevent re-adsorption of $O_2$ and $H_2O$ before melting. The speed of travel of the laser 22 (or beam 24a-c) to the frit pattern can range from between about 0.5 mm/s to as much as 300 mm/s, although a speed of between 30 mm/s and 40 mm/s or 50 mm/s is more typical. The power necessary from the laser beam may vary depending on the optical absorption coefficient $\alpha$ and thickness h of frit 14. The necessary power is also affected if a reflective or absorbent layer is placed beneath frit 14 (between frit 14 and substrate 16) such as materials used to fabricate electrode(s) 20, and by the speed of traverse of laser beam 24a-c over the frit. Additionally, the composition, homogeneity and filler particle size of the frit 14 can vary. This, too, can adversely affect the way the frit absorbs the optical energy of impinging laser beam 24a-c. As laser beam 24a-c is traversed over frit 14, frit 14 melts to seal substrates 12 and 16 one to the other. The gap between substrate 12 and 16 caused by the frit seal forms a hermetic pocket or envelope for OLED element 18 between the substrates. It should be noted that if second substrate 16 is transparent at the sealing wavelength, sealing may be performed through second substrate 16, in which case the second substrate would be placed on top of the first substrate. Sealing may also be performed through both substrates 12 and 16.

Cooling of display device 10 should be undertaken such that excess stress is not experienced by device 10 (e.g. frit 14 and substrates 12 and 16) during the cooling down of the just-sealed substrates and frit. Unless properly cooled, these stresses may result in a weak bond between the substrates, and impact the hermeticity of the bond.

The laser beam 24a-c which impinges on the frit 14 through one of the substrates typically has a substantially circular beam shape in a radial cross section and a Gaussian beam intensity profile. The beam therefore impinges on the frit as a generally circular spot, and the intensity distribution across a diameter of the beam decreases as a function of distance from the central axis of the beam, which has a peak intensity at or near the center axis of the beam. The diameter $2\omega$ of the spot in a conventional sealing method (where $\omega$ is that distance from the beam axis for which the intensity of the beam is $1/e^2$ the maximum beam intensity) is chosen to be generally about equal to or less than the width of the frit—on the order of between about 0.5 and 1 mm. However, for fast sealing speeds, e.g. greater than about 10 mm/s, a laser spot diameter of less than about 1 mm may result in rapid heating and cooling of the frit/substrate as the spot leaves a particular point on the frit, when what is desired is a relatively slow heat up and cool down which can result in an anneal of the frit/substrate.

As a general rule, a faster sealing speed is desirable. First, process throughput is increased. Second, the acceptable variation in laser power is greater at a faster sealing speed. On the other hand, an increase in the diameter of the spot to mitigate rapid cooling may lead to a heating of the adjacent OLED element sandwiched between the substrates. To overcome this drawback when employing a laser beam having an increased spot diameter (larger than the width of the frit), a mask may be located between the laser and the first or second substrate, as the case may be, such that the laser beam is directed through the mask. In this way, a portion of the enlarged spot size is masked and prevented from heating a portion of device 10 other than the frit (e.g. OLED element 18).

A spot diameter greater than about 2 times the width of the frit line between first and second substrates 12, 16, with a beam intensity distribution across a diameter of the spot that decreasing as a function of distance from a center axis of the beam may be employed. For example, the beam may have a substantially Gaussian intensity profile, but may have other shapes, such as triangular. The beam intensity gradient of the laser beam provides for a relatively gradual heat up and cool down of the frit 14 as the laser beam 24a-c travels along the frit line 14, thereby lowering temperature gradients within the frit and reducing the likelihood of undesirable cracking of the frit.

Figure 5:
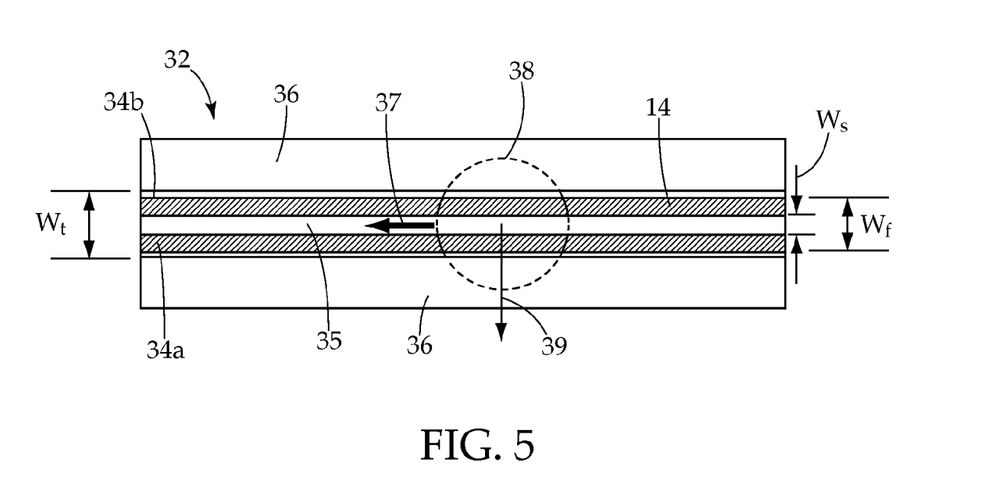
FIG. 5 is a partial top view of the mask of FIG. 4 and a portion of the frit.

A mask 32 according an embodiment of the present invention is shown in FIGS. 4 and 5 positioned over the first substrate. Mask 32 is positioned such that a transparent or open portion 34a,b of the mask is positioned above the line of frit 14 disposed between the substrates. FIG. 5 shows a close-up view of a portion of mask 32 comprising an open or substantially transparent transmission region or window 34 having a width $w_t$ approximately equal to or, depending on the distance between the mask and first substrate 12, wider than the width of the frit line, $w_f$, and an opaque non-transmission region 36. The mask according to one embodiment of the present invention includes a narrow opaque or non-transmission strip 35 of mask or other material with a width $w_s$ in the center of the open transmission region 34. The narrow mask strip 35 blocks a center portion 24b of the laser beam 24a-c, splitting the laser beam in to two separate beams 24a and 24c with separate intensity peaks that pass through remaining open transmission regions 34a and 34b.

The width of the narrow mask strip is believed to be independent of the width of the frit line being melted. It has been found the mask strips having a width $w_s$ less than about 100 µm, or from about 50 µm to about 80 µm, or about 50 µm perform well. The edges of the mask should be even with the edges of the frit line 14, or no more than about 50 µm beyond the edge of the frit line, particularly the inner edge of the frit line, or there is an increased risk of damaging leads or OLED material.

Figure 6:
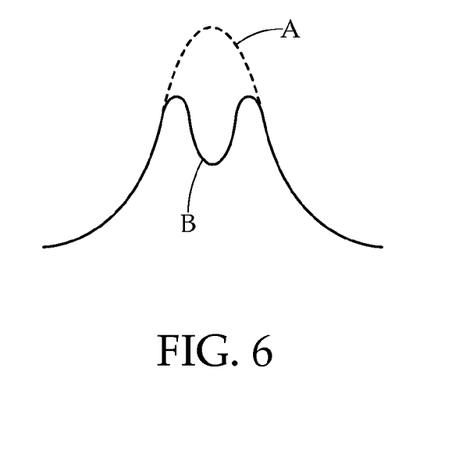
FIG. 6 is a graphical illustration of the temperature distributions created across the frit line when sealing with a mask with a central mask strip according to the present invention and when sealing with a mask without a central mask strip according to the present invention.

The narrow mask strip 35 blocks the central portion 24b of laser beam 24a-c, and thereby blocks the portion of the beam with the highest beam intensity. The beam intensity peaks of the two remaining portions 24a and 24c of the laser beam are spaced apart on either side of the narrow mask strip and have a lower peak intensity than the blocked central portion of the laser beam. Thus, a more uniform flatter beam intensity distribution is created across the frit line 14 with a lower peak beam intensity, which results in a more uniform thermal (temperature) distribution across the frit line with a lower peak temperature in the frit during laser sealing. In FIG. 6, line A represents an approximation of the temperature distribution across the frit when sealing with a mask without a central narrow mask strip according to the present invention and line B represents an approximation the temperature distribution across the frit when sealing with a mask having a central narrow mask strip according to the present invention. As can be seen in FIG. 6, the overall temperature gradients across the frit line and the overall peak temperature in the frit are reduced when sealing with a mask having a narrow mask strip according to the present invention.

A more even temperature distribution across the frit line also provides a more uniform melting of the fit, which enables a more complete melting of the frit across the frit line without exceeding undesirable peak frit temperatures that may damage lead, OLED or other device material located near or under the frit 14. The more complete melting across the frit line that is achievable using a mask according to the present invention creates a larger effective seal across the width of the frit line than is achievable with prior mask designs, thereby increasing the yield of "good" seals and creating a more robust, stronger and durable seal. When employing a mask without a narrow mask strip according to the present invention, it has been found difficult to achieve an effective seal width of greater than 70% of the width of the frit line without overheating the lead or other backplane materials. Increases in the effective seal width of 10 to 15% are possible when sealing with a mask having a central mask strip 35 according to the present invention compared to sealing with masks without a central mask strip. Maintaining a lower peak temperature also reduces the incidence of lead material buckling, separation of lead material from the backplane, and other deleterious effects created by excessive heat and/or temperatures in the frit.

Multiple narrow mask strips (not shown) may alternatively be employed. For example, there may be two, three or more parallel narrow mask strips (not shown) in the open transmission region 34 of the mask 32. The narrow mask strips may be of varying width. For example, there may be a relatively wide central narrow mask strip with relatively narrower narrow mask strips on either side of the central mask strip. Alternatively, the narrow mask strips may become wider or narrower approaching the center of the frame or approaching the center of the open transmission region, or a single narrow mask strip may be located off center in the open transmission region, e.g. either closer or further from the center of the frame.

Laser beam 24*a-c* is then traced along the transmission region in a longitudinal direction indicated by arrow 37 (as shown in FIG. 5) and hence over the frit line 14, heating the frit and sealing the substrates with a hermetic seal. Beam spot 38 is blocked in a width-wise direction (indicated by the dashed-line portion of spot 38, and arrow 39) on either side of frit 14 by opaque region 36 and along the center of the frit line by the opaque narrow mask strip 35, while being unobstructed in the longitudinal direction through remaining open transmission regions 34*a* and 34*b*. Because the beam (and the spot) preferably has a circularly symmetric intensity distribution, and the intensity distribution in the longitudinal direction is unobstructed, the unblocked ramp-up and tail-off of the intensity along a length of the frit (due to the increasing beam intensity distribution in the front of the beam and the decreasing beam intensity distribution in the rear of the beam relative to the direction of beam travel) provides for a relatively slow heat up and cool down of the frit. On the other hand, the portions 24*a* and 24*c* of the beam that pass through transparent regions 34*a* and 34*b* and impinge on the frit have a relatively constant (flat) intensity distribution, as discussed above, across the width of the frit (i.e. orthogonal to the direction of travel of the beam as it traverses the frit), particularly when combined together, thus providing for relatively even heating of frit 14.

Mask 32 may be absorbing or reflecting. However, a reflecting mask is preferred, since an absorbing mask may be heated sufficiently by the beam to damage the sensitive OLED element adjacent to the frit.

As discussed above, laser beam 24 employed as a sealing beam in accordance with embodiments of the invention may be unfocused, or intentionally defocused. Defocusing the beam such that a beam focus point does not fall on the frit can be used in conjunction with the decreasing intensity distribution in a longitudinal direction (relative to the line of frit) to augment the cooling of the frit and/or substrate. The diameter of the laser spot impinging on the frit may be greater than about 1.8 mm when sealing 1 mm wide frit line 14.

In another embodiment, a mask may be attached to or proximate to the laser itself, the beam from the laser passing through the mask as the mask moves with the laser over the frit line 14. In such an embodiment, the mask could be a circular aperture with a dot of mask material in its center to block the peak of the laser beam. Alternatively, in order to maintain the more gradual ramp-up and ramp down of the frit as previously described herein, the aperture may be an elongate oval with an elongate oval spot of mask material in the center, or the mask may have a slit-shaped transmission region with a narrow strip of mask material therein. However, an elongate or slit-like aperture or transparent region may require a rotation of the mask as the laser traverses a corner of a frame-shaped frit deposited on substrate 12 in order to maintain the length of the elongated transmission region aligned with the frit wall. Alternatively, the mask may be held by a fixture that remains fixed relative to the table or stage that holds the device 10. The mask may alternatively be placed directly on top of the device 10, or even formed on the first 42, or second 43, substrates and, if desired, later removed.

Figure 8:
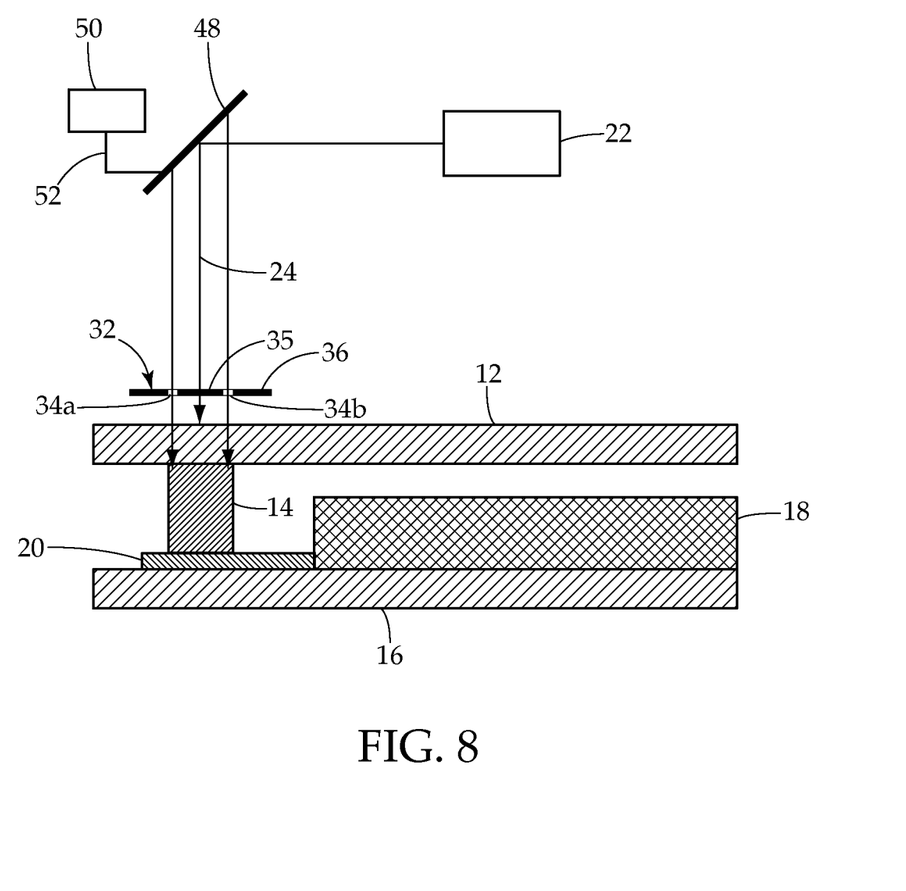
FIG. 8 is a partial cross sectional side view as in FIG. 4, wherein a mirror is employed to traverse the laser beam along the frit.

In either this or the previous embodiment, relative motion between device 10 and laser beam 24*a-c* may be accomplished by moving device 10 relative to the laser beam, or moving the laser (and therefore the beam) relative to the device. For example, the laser, or the device, may be mounted to a platform, table or stage movable in an x-y plane. The stage can be, for example, a linear motor stage whose movement may be computer controlled. As previously mentioned, the mask may be mounted with either the laser or the device, and move with the laser or remain stationary with the device. Alternatively, both the device and the laser may be stationary, and the beam moved relative to the device by directing beam 24*a-c* from the laser to one or more movable reflectors (mirrors) 48, controlled (moved) by galvometers (as shown in FIG. 8). The low inertia of galvometer-positioned mirrors, compared to the inertia of the device or laser, provides for rapid traverse speeds for the laser beam over frit 14. A constant spot diameter on the frit as the distance between the frit and the laser varies can be attained by using appropriate lensing techniques (e.g. telecentric lenses), as are known in the art.

Figure 7:
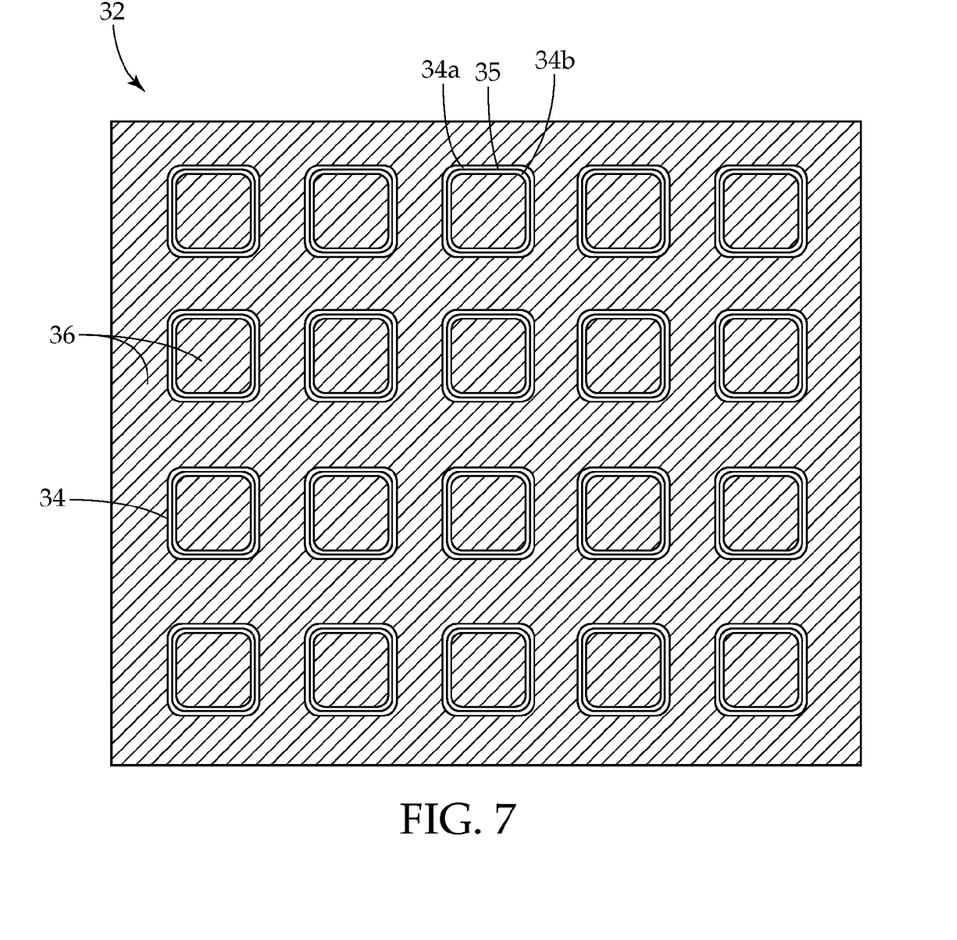
FIG. 7 is a top view of a mask having a plurality of transparent regions with a central mask strip according to the present invention for sealing a plurality of OLED display devices.

The mask 36 may be formed in any known manner as is well known in the art of semiconductor device manufacturing or other art. For example, the mask 32 may be formed by sputtering a coating overtop a clear glass substrate such that the coated portions of the mask reflect or absorb the light from the laser, and a portion of the impinging beam is transmitted through the uncoated clear glass portion or portions 34 of the mask. Preferably, the transparent portions of the mask coincide with frit line 14. For example, if frit line 14 is in the shape of a frame, it is desirable that the transparent portion of the mask have a similar shape and dimensions. If a plurality of individual, frame-like frit walls are disposed on a substrate, then it is preferred that the mask have a corresponding array of a plurality of individual transparent regions 34. Such a mask is depicted in FIG. 7.

A reflective mask according the present invention may alternatively be produced by a process that utilizes the same equipment employed to dispense the frit wall 14. Such a mask process may include the following process steps. First, determine the desired mask design, e.g. the desired pattern for the open transmission regions or windows 34a and 34b. Dispense a frit pattern onto a glass substrate that corresponds to the desired open transmission regions or windows 34a and 34b and allow the frit to air dry. Deposit a suitably thick layer of aluminum or other suitable material onto the glass substrate. Then deposit a suitably thick layer of copper or other suitable reflective material onto the previously deposited layer. Gently remove the frit using a suitable solvent and laboratory wipe process, thereby removing the aluminum and copper layers along with the frit and forming the desire open transmission regions 34a and 34b through the aluminum and copper layers. The mask is now ready for use.

It should be emphasized that the above-described embodiments of the present invention, particularly any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A system for laser sealing a temperature and environmentally sensitive element comprising:
   a first substrate and a second substrate separated by at least one frit wall having a height extending between the first and second substrates and a width;
   at least one temperature and environmentally sensitive element disposed between the first and second substrates and surrounded by the frit wall;
   a table, the first substrate and the second substrate with the at least one temperature and environmentally sensitive element surrounded by the frit wall between the first and second substrates being supported on the table;
   a laser that generates a laser beam having a generally circular beam profile having a diameter that is larger than the width of the frit wall;
   an opaque mask located between the laser and the first or the second substrate for blocking a portion of the laser beam, the mask having a transparent elongate transmission region having a length and a width in the opaque material for allowing an elongate portion of the laser beam to pass through the mask, the width of the transmission region being substantially equal to the width of the frit wall, and a strip of opaque material extending approximately along a longitudinal center line of the elongate transmission region for entirely blocking a central portion of the elongate portion of the laser beam, the mask being oriented with the elongate transmission region aligned with the frit wall; and
   a fixture, the laser being mounted to the fixture to direct the laser beam through the transmission region in the mask, whereby the transmitted portion of the laser beam impinges upon the frit wall, melting the frit wall, without overheating and damaging the element, thereby joining the first and second substrates and hermetically sealing the element therebetween.

2. The system according to claim 1, wherein the elongate transmission region and the strip of opaque material are generally elliptical.

3. The system according to claim 1, wherein the elongate transmission region and the strip of opaque material are generally slit shaped.

4. The system according to claim 1, further comprising a motion control mechanism operatively connected to at least one of the fixture and the table to create relative motion between the table and the fixture, whereby the transmitted portion of the laser traverses the frit wall, melting the frit wall.

5. The system according to claim 4, wherein the frit wall comprises a closed frame surrounding the element, the transmission region and the strip of opaque material are formed in a correspondingly sized and shaped closed frame, and the mask is held stationary relative the table with the transmission region aligned with the frit wall.

6. The system according to claim 5, wherein the motion control mechanism is operatively connected to the fixture to move the fixture relative to the table.

7. The system according to claim 5, wherein the motion control mechanism is operatively connected to the table to move the table relative to the fixture.

8. The system according to claim 4, wherein the mask is held stationary relative the laser with the transmission region aligned with the frit wall, and the motion control mechanism is operatively connected to the fixture to move the fixture relative to the table.

9. The system according to claim 1, wherein the temperature and environmentally sensitive element is at least one OLED device.

10. The system according to claim 1, wherein the mask comprises a reflective surface.

11. A system for laser sealing a temperature and environmentally sensitive element comprising:
    a first substrate and a second substrate separated by at least one frit wall having a height extending between the first and second substrates and a width;
    a laser that emits a generally circular beam having a diameter that is larger than the width of the frit wall;
    at least one temperature and environmentally sensitive element disposed between the first and second substrates and surrounded by the frit wall; and
    an opaque mask having a substantially transparent elongate transmission region having a length and a width in the opaque material, the width of the transmission region being substantially equal to the width of the frit wall, and a strip of opaque material extending approximately along a longitudinal center line of the elongate transmission region, wherein the mask is located between the laser and one of the first substrate or second substrate with the length of the elongate transmission region aligned with the frit wall, such that the strip of opaque material entirely blocks a central portion of the frit wall, and the transparent transmission region allows a portion of the laser beam to pass through the mask and impinge upon edge portions of the frit wall to melt the frit wall, thereby joining the first and second substrates and hermetically sealing the element therebetween.

12. The system according to claim 11, wherein the elongate transmission region and the strip of opaque material are generally elliptical.

13. The system according to claim 11, wherein the elongate transmission region and the strip of opaque material are generally slit shaped.

14. The system according to claim 11, further comprising a table, the first substrate and the second substrate with the at least one temperature and environmentally sensitive element surrounded by the frit wall between the first and second substrates being supported on the table.

15. The system according to claim 14, further comprising a motion control mechanism operatively connected to the table to move the table, whereby the transmitted portion of the laser traverses the frit wall, melting the frit wall.

16. The system according to claim 15, wherein the frit wall comprises a closed frame surrounding the element, the transmission region and the strip of opaque material are formed in a correspondingly sized and shaped closed frame, and the mask is held stationary relative the table with the transmission region aligned with the frit wall.

17. The system according to claim 11, further comprising a fixture, the laser being mounted to the fixture to direct the laser beam through the transmission region in the mask, whereby the transmitted portion of the laser beam impinges upon the frit wall, melting the frit wall, without overheating and damaging the element, thereby joining the first and second substrates and hermetically sealing the element therebetween.

18. The system according to claim 17, further comprising a motion control mechanism operatively connected to the fixture to move the fixture, whereby the transmitted portion of the laser traverses the frit wall, melting the frit wall.

19. The system according to claim 18, wherein the mask is held stationary relative the laser with the transmission region aligned with the frit wall.

20. The system according to claim 11, wherein the temperature and environmentally sensitive element is at least one OLED device.

21. The system according to claim 11, wherein the mask comprises a reflective surface.

* * * * *